(12) United States Patent
Chen et al.

(10) Patent No.: US 11,276,995 B2
(45) Date of Patent: Mar. 15, 2022

(54) CABLE MANAGEMENT ASSEMBLY

(71) Applicants: KING SLIDE WORKS CO., LTD., Kaohsiung (TW); KING SLIDE TECHNOLOGY CO, LTD., Kaohsiung (TW)

(72) Inventors: Ken-Ching Chen, Kaohsiung (TW); Shun-Ho Yang, Kaohsiung (TW); Kai-Wen Yu, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 16/819,653

(22) Filed: Mar. 16, 2020

(65) Prior Publication Data

US 2021/0119429 A1 Apr. 22, 2021

(30) Foreign Application Priority Data

Oct. 18, 2019 (TW) .................................. 108137979

(51) Int. Cl.
*H02G 3/04* (2006.01)
*F16L 3/12* (2006.01)
*H02G 11/00* (2006.01)

(52) U.S. Cl.
CPC .......... *H02G 3/0456* (2013.01); *F16L 3/1218* (2013.01); *H02G 3/0406* (2013.01); *H02G 11/00* (2013.01)

(58) Field of Classification Search
CPC .... H02G 3/0456; H02G 3/0406; H02G 11/00; H02G 3/0418; H02G 3/26; F16L 3/1218; H05K 7/1491; H16L 3/08
See application file for complete search history.

(56) References Cited

U.S. PATENT DOCUMENTS

| 7,554,819 | B2 | 6/2009 | Chen et al. |
| 9,402,329 | B1 * | 7/2016 | Chen .......................... F16L 3/08 |
| 10,117,351 | B2 * | 10/2018 | Chen ..................... H05K 7/1491 |
| 10,356,932 | B2 * | 7/2019 | Chen ..................... H05K 7/1491 |
| 10,389,100 | B2 * | 8/2019 | Chen ......................... H05K 7/14 |
| 10,638,636 | B1 * | 4/2020 | Chen ..................... H01R 9/2416 |
| 2019/0053396 | A1 * | 2/2019 | Chen ....................... H02G 11/00 |
| 2019/0090378 | A1 * | 3/2019 | Chen ......................... H05K 7/18 |
| 2021/0135443 | A1 * | 5/2021 | Chen ..................... H05K 7/1491 |

FOREIGN PATENT DOCUMENTS

| EP | 3041329 A1 * | 7/2016 | ........... H05K 7/1491 |
| EP | 3442316 A1 * | 2/2019 | ........... H05K 7/1491 |

* cited by examiner

*Primary Examiner* — Terrell L Mckinnon
*Assistant Examiner* — Ding Y Tan
(74) *Attorney, Agent, or Firm* — Rosenberg, Klein & Lee

(57) ABSTRACT

A cable management assembly includes an arm and a cable management device to be mounted on the arm. The arm includes a mounting hole and a positioning hole. The cable management device includes a wall provided with a mounting portion and an elastic portion. The elastic portion includes a connecting section disposed on the wall and an elastic section connected to the connecting section and including an engaging feature. The mounting portion of the cable management device can enter the mounting hole of the arm and be blocked by a blocking section adjacent to the mounting hole such that the cable management device is mounted to the positioning hole through the engaging feature of the elastic section.

9 Claims, 5 Drawing Sheets

CABLE MANAGEMENT ASSEMBLY

FIELD OF THE INVENTION

The present invention relates to a cable management mechanism and more particularly to a cable management assembly with a cable management device.

BACKGROUND OF THE INVENTION

U.S. Pat. No. 9,402,329 B1 discloses a cable management assembly that includes a cable management arm and a cable management device. The cable management arm includes a first mounting hole and a first positioning hole. The first mounting hole includes a first hole portion and a second hole portion. The cable management device is detachably mounted on the cable management arm and includes a first mounting portion and an elastic portion. The first mounting portion of the cable management device can enter the second hole portion of the first mounting hole from the first hole portion and be blocked by a first blocking section adjacent to the second hole portion such that the elastic portion of the cable management device enters the first positioning hole and ends up blocked by at least one blocking wall of the cable management arm. The elastic portion of the cable management device includes a first section and a second section corresponding to the first section. The first section is connected to a base and is provided with a clasp arm to be fastened to the cable management arm.

As the entire elastic portion is in the first positioning hole when the cable management device is mounted on the cable management arm, it is difficult to operate the elastic portion and move the elastic portion out of the first positioning hole in order to detach the cable management device from the cable management arm. Moreover, as user needs vary, there may be cases where it is undesirable to arrange or mount the cable management device and the cable management arm in the way described above. Given the diversity of user needs, therefore, it is worthwhile to develop a different cable management product.

SUMMARY OF THE INVENTION

One objective of the present invention is to provide a cable management assembly in which the cable management device is mounted on the cable management arm in an easily detachable manner.

According to one aspect of the present invention, a cable management assembly includes a first arm and a cable management device. The first arm includes a first connecting structure. The first connecting structure includes a first mounting hole and a first positioning hole, wherein the first mounting hole includes a first hole portion and a second hole portion. The cable management device is configured to be mounted on the first arm and includes a wall, a first mounting portion, and an elastic portion. The first mounting portion is connected to the wall and includes a first extension section and a second extension section bent with respect to the first extension section. The elastic portion is disposed on the wall and includes a connecting section and an elastic section. The connecting section is disposed on the wall. The elastic section is connected to the connecting section and is provided with an engaging feature. The first extension section of the first mounting portion of the cable management device can enter the second hole portion of the first mounting hole of the first arm from the first hole portion, in order for the second extension section of the first mounting portion to be blocked by a first blocking section adjacent to the second hole portion of the first mounting hole, and for the cable management device to be mounted to the first positioning hole through the engaging feature of the elastic section.

Preferably, the second extension section of the first mounting portion is substantially perpendicularly connected to the first extension section.

Preferably, the cable management device is configured to be mounted on the first arm in a detachable manner.

Preferably, the first connecting structure of the first arm further includes a second mounting hole, and the cable management device further includes a second mounting portion. The second mounting hole includes a third hole portion and a fourth hole portion. The second mounting portion is connected to the wall and includes a third extension section and a fourth extension section bent with respect to the third extension section. The third extension section of the second mounting portion can enter the fourth hole portion of the second mounting hole from the third hole portion, in order for the fourth extension section of the second mounting portion to be blocked by a second blocking section adjacent to the fourth hole portion of the second mounting hole.

Preferably, the first mounting hole and the second mounting hole are located at two opposing positions of the first arm respectively.

Preferably, the fourth extension section of the second mounting portion and the second extension section of the first mounting portion extend in opposite directions respectively.

Preferably, the first arm further includes a second connecting structure, and the second connecting structure has substantially the same structural configuration as the first connecting structure. Once the cable management device is detached from the first connecting structure and the first arm is turned through an angle, the first mounting portion and the elastic portion of the cable management device can be mounted to the second connecting structure.

Preferably, the wall of the cable management device has a recess, and the elastic section of the elastic portion corresponds to the recess.

Preferably, the cable management assembly further includes a second arm. A first end portion of the first arm and a first end portion of the second arm are pivotally connected with respect to each other. A second end portion of the first arm and a second end portion of the second arm are provided with a first connection device and a second connection device respectively.

Preferably, the first positioning hole brings a first side and a second side of the first arm into communication, and the cable management device further includes a releasing portion connected to the elastic section of the elastic portion. The releasing portion is located on the first side. The engaging feature of the elastic section extends from the first side through the first positioning hole to the second side. The releasing portion is configured to operate the engaging feature of the elastic section of the elastic portion in order to disengage the engaging feature from the first positioning hole.

According to another aspect of the present invention, a cable management assembly includes a first arm and a cable management device. The first arm includes a first connecting structure. The first connecting structure includes a first mounting hole and a first positioning hole, wherein the first mounting hole includes a first hole portion and a second hole portion smaller than the first hole portion. The cable management device is configured to be mounted on the first arm and includes a wall, a first mounting portion, and an elastic portion. The first mounting portion is connected to the wall and includes a first extension section and a second extension section connected to the first extension section. The elastic portion is disposed on the wall and includes a connecting section and an elastic section. The connecting section is disposed on the wall. The elastic section is connected to the connecting section and is provided with an engaging feature. In the course in which the first extension section of the first mounting portion of the cable management device enters the second hole portion of the first mounting hole of the first arm from the first hole portion, the elastic section of the elastic portion of the cable management device accumulates an elastic force. Once the second extension section of the first mounting portion is blocked by a first blocking section adjacent to the second hole portion of the first mounting hole, the elastic section of the elastic portion of the cable management device releases the elastic force such that the engaging feature of the elastic section is brought into engagement with the first positioning hole and is eventually blocked by at least one blocking wall around the first positioning hole.

DETAILED DESCRIPTION OF THE INVENTION

Figure 1:
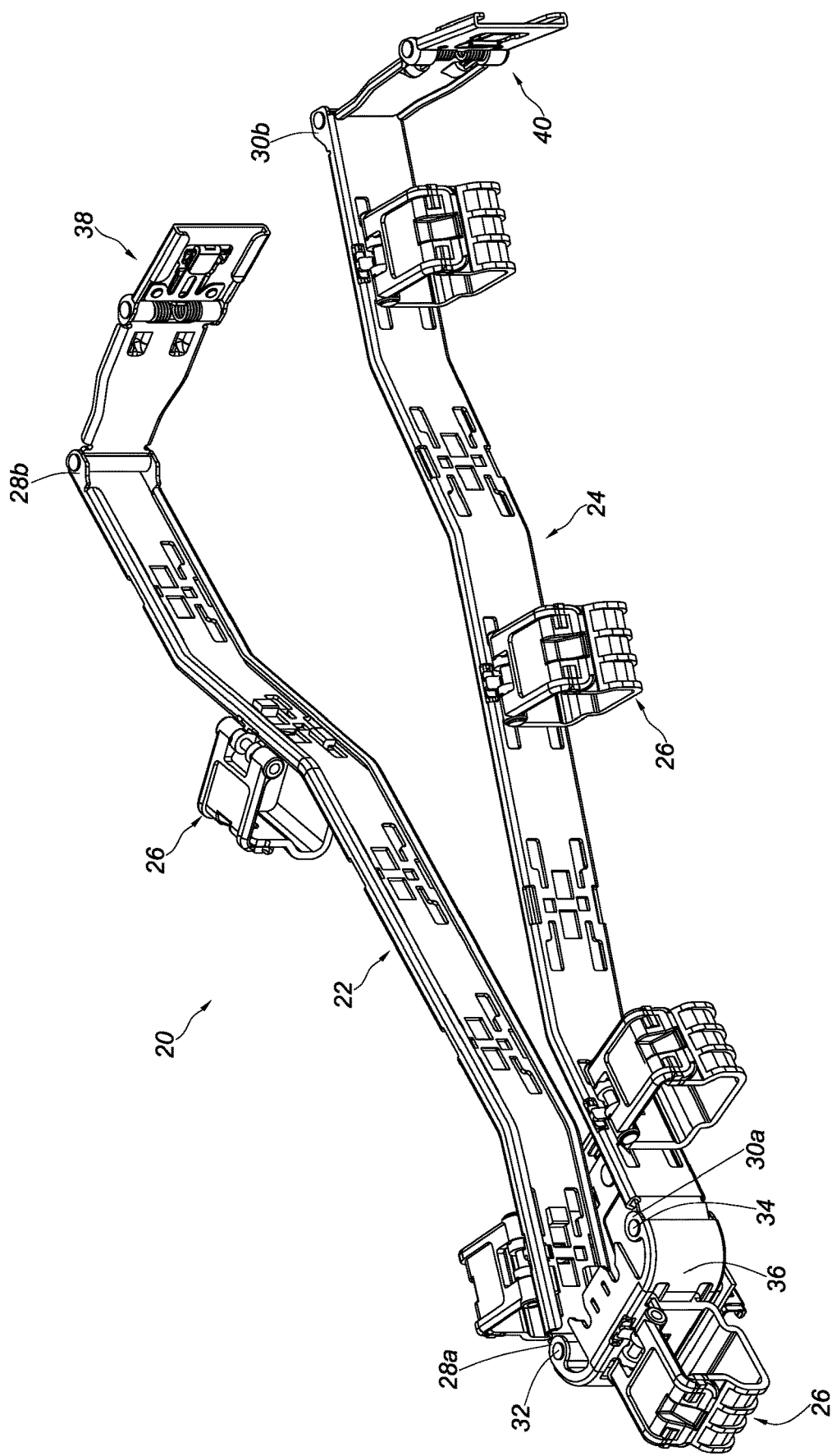
FIG. 1 is a perspective view of the cable management assembly according to an embodiment of the present invention.
Figure 2:
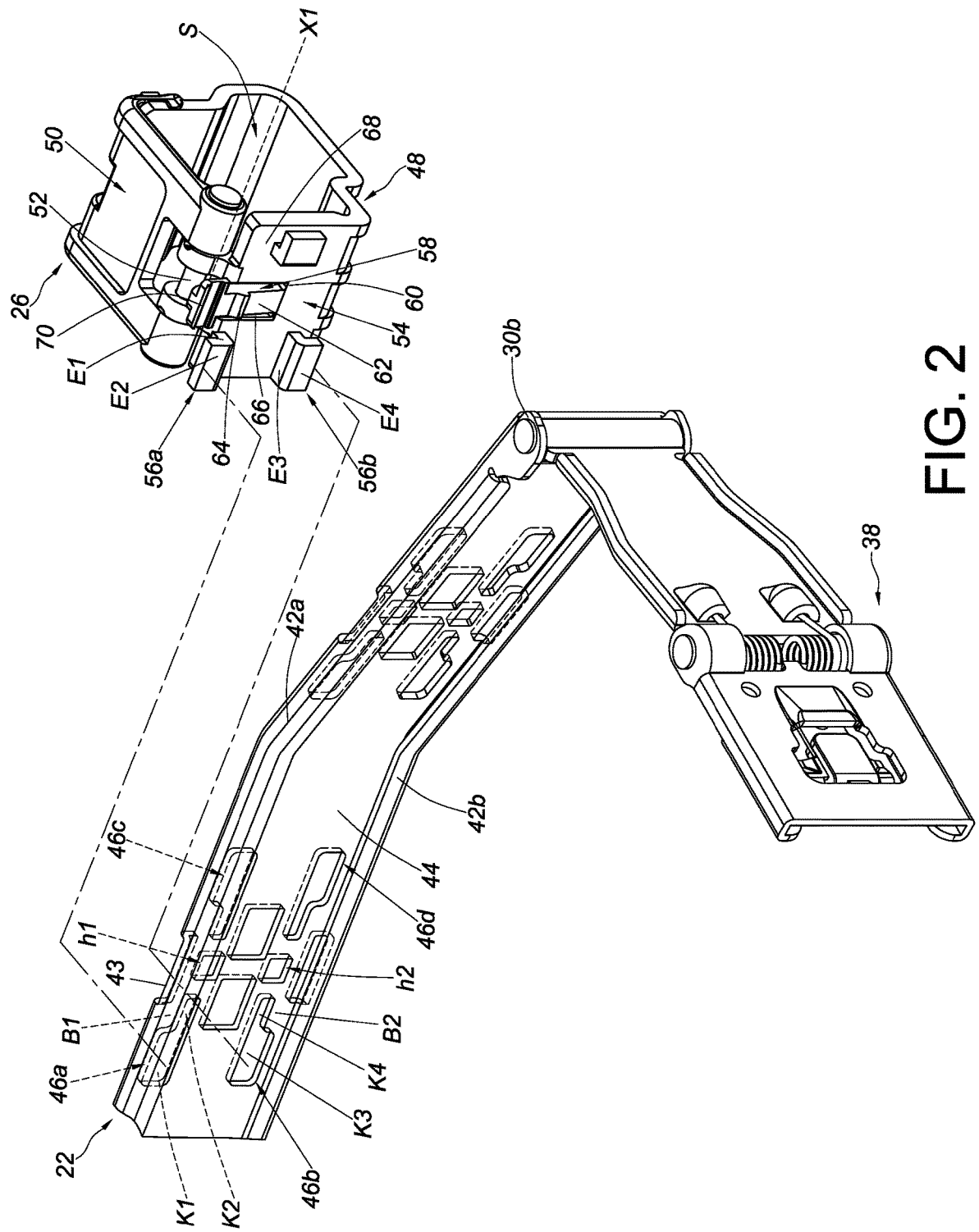
FIG. 2 is an exploded perspective view showing a cable management arm and a cable management device of the cable management assembly according to the embodiment of the present invention.

Referring to FIG. 1 and FIG. 2, the cable management assembly 20 according to an embodiment of the present invention includes a first arm 22, a second arm 24, and a plurality of cable management devices 26. The cable management devices 26 are configured to be mounted on either one of the first arm 22 and the second arm 24. Here, each of the first arm 22 and the second arm 24 is provided with some of the cable management devices 26 by way of example.

The first arm 22 has a first end portion 28a and a second end portion 28b Similarly, the second arm 24 has a first end portion 30a and a second end portion 30b. The first end portion 28a of the first arm 22 and the first end portion 30a of the second arm 24 are pivotally connected with respect to each other. Here, by way of example, the first end portion 28a of the first arm 22 and the first end portion 30a of the second arm 24 are pivotally connected to two opposite ends of a connecting base 36 by a first shaft 32 and a second shaft 34 respectively. In an alternative embodiment, the first end portion 28a of the first arm 22 and the first end portion 30a of the second arm 24 may be directly pivotally connected to each other. The present invention has no limitation as to whether the first end portion 28a of the first arm 22 and the first end portion 30a of the second arm 24 are pivotally connected in a direct or indirect manner. The second end portion 28b of the first arm 22 and the second end portion 30b of the second arm 24 are provided (e.g., pivotally connected) with a first connection device 38 and a second connection device 40 respectively. The first connection device 38 and the second connection device 40 are configured to mount the cable management assembly 20 to a first target object and a second target object, such as but not limited to a fixed rail and a movable rail of a slide rail assembly (not shown), respectively.

As shown in FIG. 2, the first arm 22 has an upper wall 42a, a lower wall 42b, and an extension wall 44 connected between the upper wall 42a and the lower wall 42b. The first arm 22 includes a first connecting structure on the extension wall 44, and the first connecting structure includes a first mounting hole 46a and a first positioning hole h1.

The first mounting hole 46a includes a first hole portion K1 and a second hole portion K2 in communication with the first hole portion K1. The second hole portion K2 is smaller than the first hole portion K1.

Preferably, the first connecting structure of the first arm 22 further includes a second mounting hole 46b, and the second mounting hole 46b includes a third hole portion K3 and a fourth hole portion K4 in communication with the third hole portion K3. The fourth hole portion K4 is smaller than the third hole portion K3. The second mounting hole 46b and the first mounting hole 46a have substantially the same structural configuration.

Preferably, the first mounting hole 46a and the second mounting hole 46b are located at two opposing positions of the first arm 22 respectively. For example, the first mounting hole 46a and the second mounting hole 46b are adjacent to the upper wall 42a and the lower wall 42b of the first arm 22 respectively.

With continued reference to FIG. 2, the cable management device 26 is configured to be mounted on the first arm 22 and includes a main body 48 and a cover 50. The cover 50 is pivotally connected with respect to the main body 48 via a pin 52 so as to be opened and closed with respect to the main body 48. The main body 48 and the cover 50 jointly define a receiving space S through which cables can be passed.

More specifically, the main body 48 of the cable management device 26 includes a wall 54, a first mounting portion 56a, and an elastic portion 58.

The first mounting portion 56a is connected to the wall 54 and includes a first extension section E1 and a second extension section E2. The second extension section E2 is bent with respect to the first extension section E1. The first extension section E1 and the second extension section E2 jointly constitute the first mounting portion 56a. Preferably, the second extension section E2 is substantially perpendicularly connected to the first extension section E1. The elastic portion 58 is disposed on the wall 54 and includes a connecting section 60 and an elastic section 62. The connecting section 60 is disposed on the wall 54, and the elastic section 62 is connected to and extends from the connecting section 60. The elastic section 62 is provided with an engaging feature 64. Here, the engaging feature 64 is a projection protruding from the elastic section 62 by way of example; the present invention, however, has no limitation on the configuration of the engaging feature 64. Preferably, the wall 54 of the cable management device 26 is formed with a recess 66, and the elastic section 62 of the elastic portion 58 corresponds to and is located in the recess 66. The elastic section 62 in FIG. 2 is in a first predetermined state X1, in which the elastic section 62 is tilted outward at an angle with respect to the wall surface 68 of the wall 54.

Preferably, the main body 48 of the cable management device 26 further includes a second mounting portion 56b. The second mounting portion 56b is connected to the wall 54 and includes a third extension section E3 and a fourth extension section E4 bent with respect to the third extension section E3. The third extension section E3 and the fourth extension section E4 jointly constitute the second mounting portion 56b. Preferably, the fourth extension section E4 is substantially perpendicularly connected to the third extension section E3. Preferably, the fourth extension section E4 and the second extension section E2 extend in opposite directions respectively. For example, the fourth extension section E4 extends toward the lower wall 42b of the first arm 22 while the second extension section E2 extends toward the upper wall 42a of the first arm 22.

Figure 3:
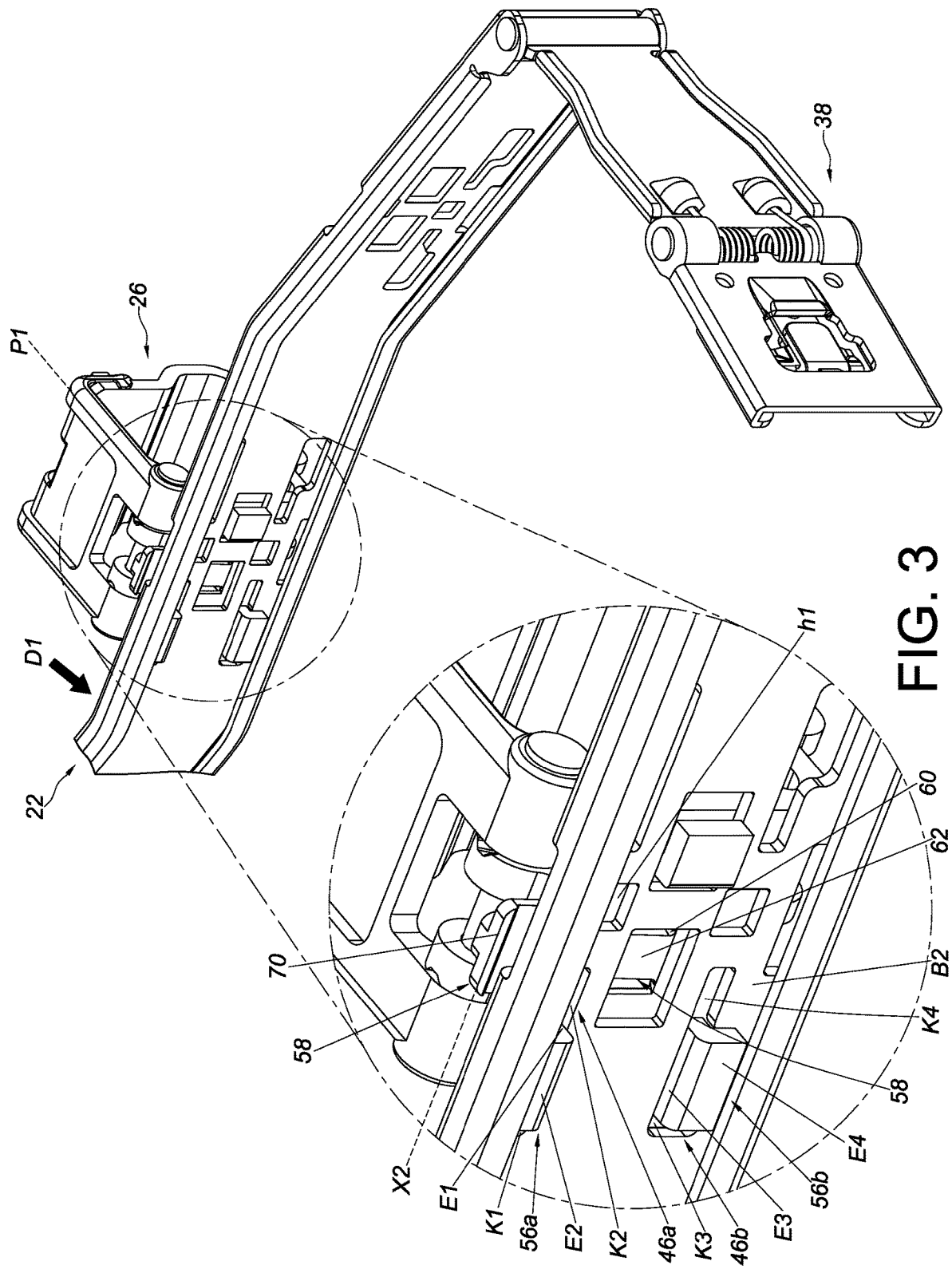
FIG. 3 is a schematic view showing the process of mounting the cable management device to the cable management arm according to the embodiment of the present invention.
Figure 4:
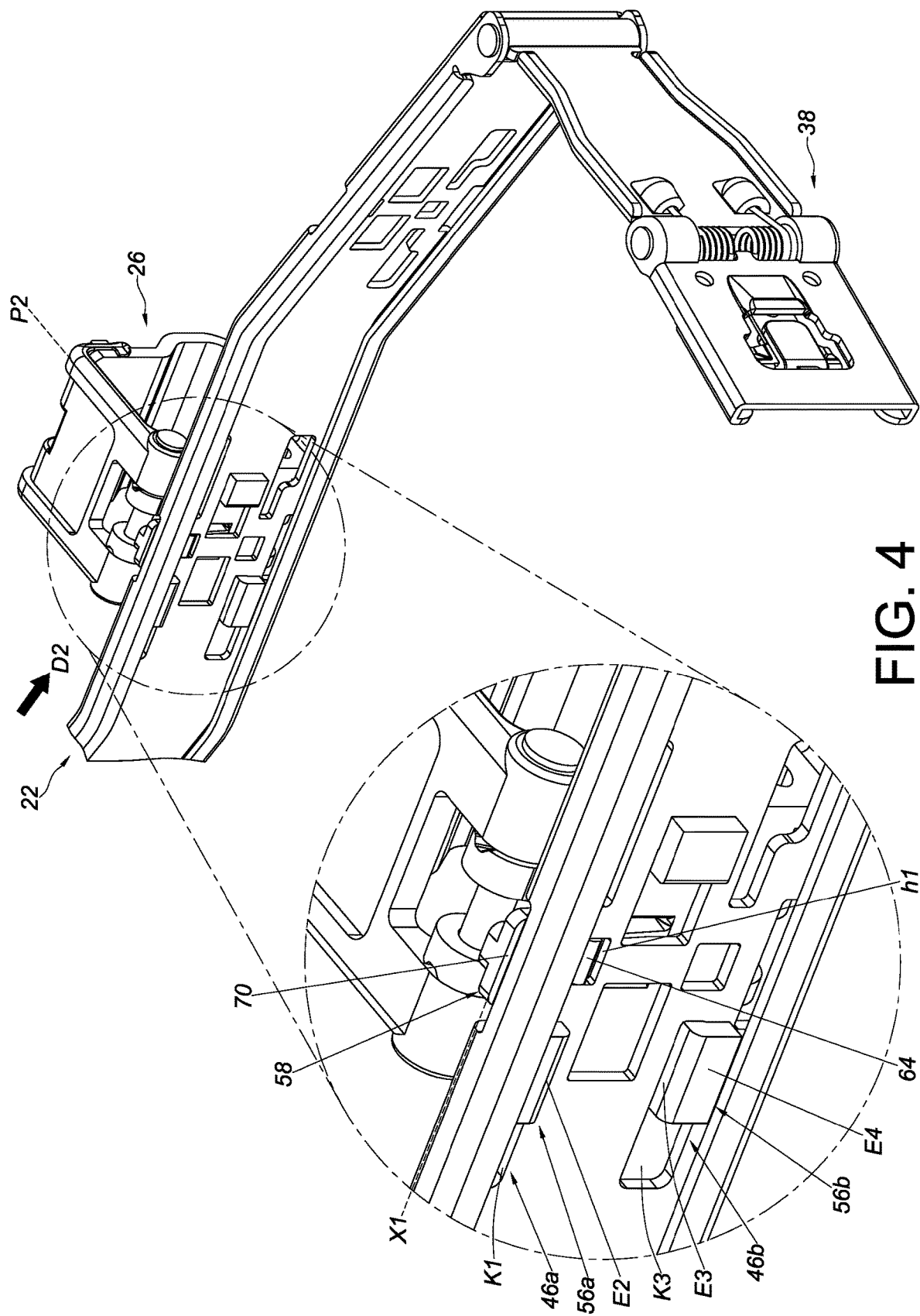
FIG. 4 is a schematic view showing that the cable management device is mounted to the cable management arm according to the embodiment of the present invention.

In the course in which the cable management device 26 is mounted to the first arm 22, referring to FIG. 2, FIG. 3, and FIG. 4, the cable management device 26 is moved from a first position P1 (see FIG. 3) to a second position P2 (see FIG. 4) with respect to the first arm 22.

More specifically, the first extension section E1 and the second extension section E2 of the first mounting portion 56a of the cable management device 26 can be inserted into the first hole portion K1 of the first mounting hole 46a of the first arm 22 in a first direction D1 (see FIG. 3) Similarly, the third extension section E3 and the fourth extension section E4 of the second mounting portion 56b of the cable management device 26 can be inserted into the third hole portion K3 of the second mounting hole 46b of the first arm 22 in the first direction D1 too. Once the above insertion step is completed, the cable management device 26 is at the first position P1 (see FIG. 3). Moreover, when the cable management device 26 is at the first position P1, the elastic section 62 of the elastic portion 58 is in a second predetermined state X2, in which the elastic section 62 of the elastic portion 58 is in contact with one side of the first arm 22 and accumulates an elastic force.

When the cable management device 26 is displaced with respect to the first arm 22 from the first position P1 to the second position P2 in a second direction D2 (see FIG. 4), the first extension section E1 of the first mounting portion 56a of the cable management device 26 is brought into the second hole portion K2 of the first mounting hole 46a; as a result, the second extension section E2 of the first mounting portion 56a is blocked by a first blocking section B1 (see FIG. 2) adjacent to the second hole portion K2 of the first mounting hole 46a to prevent the cable management device 26 from being displaced in the opposite direction of the first direction D1 Similarly, the third extension section E3 of the second mounting portion 56b of the cable management device 26 is brought into the fourth hole portion K4 of the second mounting hole 46b such that the fourth extension section E4 of the second mounting portion 56b is blocked by a second blocking section B2 (see FIG. 2) adjacent to the fourth hole portion K4 of the second mounting hole 46b, making it impossible to displace the cable management device 26 in the opposite direction of the first direction D1. In addition, when the cable management device 26 is at the second position P2, the engaging feature 64 of the elastic section 62 of the elastic portion 58 corresponds in position to the first positioning hole h1, and because of that, the elastic section 62 of the elastic portion 58 releases the elastic force accumulated therein and returns to the first predetermined state X1 from the second predetermined state X2, thereby mounting the engaging feature 64 of the elastic section 62 to the first positioning hole h1 of the first arm 22, or more particularly bringing the engaging feature 64 of the elastic section 62 into engagement between the plural hole walls of the first positioning hole h1 of the first arm 22. It can be known from the above that the process of mounting the cable management device 26 to the first arm 22 is completed when the cable management device 26 is at the second position P2. It is worth mentioning that the first direction D1 and the second direction D2 are substantially perpendicular to each other.

Preferably, the cable management device 26 further includes a releasing portion 70 connected to the elastic section 62 of the elastic portion 58 such that the engaging feature 64 lies between the connecting section 60 and the releasing portion 70. When the cable management device 26 is mounted on the first arm 22, the releasing portion 70 of the cable management device 26 extends beyond one of the upper wall 42a and the lower wall 42b of the first arm 22, and the one of the upper wall 42a and the lower wall 42b has a notch 43 for receiving the releasing portion 70. Here, the releasing portion 70 extends beyond the upper wall 42a of the first arm 22 by way of example, making it easy for a user to apply a force to and thereby operate the releasing portion 70 in order to disengage the engaging feature 64 of the cable management device 26 from the first positioning hole h1 of the first arm 22. Once the engaging feature 64 of the cable management device 26 is disengaged from the first positioning hole h1 of the first arm 22, the cable management device 26 can be displaced back to the first position P1 in the opposite direction of the second direction D2 and then detached from the first arm 22.

Preferably, referring to FIG. 2, the first arm 22 further includes a second connecting structure, and the second connecting structure has substantially the same structural configuration as, and is the mirror-symmetric counterpart of, the first connecting structure. For example, the second connecting structure includes a third mounting hole 46c, a fourth mounting hole 46d, and a second positioning hole h2. Once the cable management device 26 is detached from the first connecting structure (i.e., the first mounting hole 46a, the first positioning hole h1, and the second mounting hole 46b) and the first arm 22 is turned through an angle (e.g., 180 degrees), the first mounting portion 56a, the second mounting portion 56b, and the elastic portion 58 of the cable management device 26 can be mounted to the second connecting structure (i.e., the fourth mounting hole 46d, the third mounting hole 46c, and the second positioning hole h2) instead, thus allowing the cable management assembly 20 to perform its intended function after being turned over from left to right or vice versa. Alternatively, the cable management device 26 can be turned through an angle (e.g., 180 degrees) and have its first mounting portion 56a, second mounting portion 56b, and elastic portion 58 mounted to the second connecting structure (i.e., the fourth mounting hole 46d, the third mounting hole 46c, and the second positioning hole h2), in order for the cover 50 of the cable management device 26 to be opened in a predetermined direction to facilitate cable storage.

Figure 5:
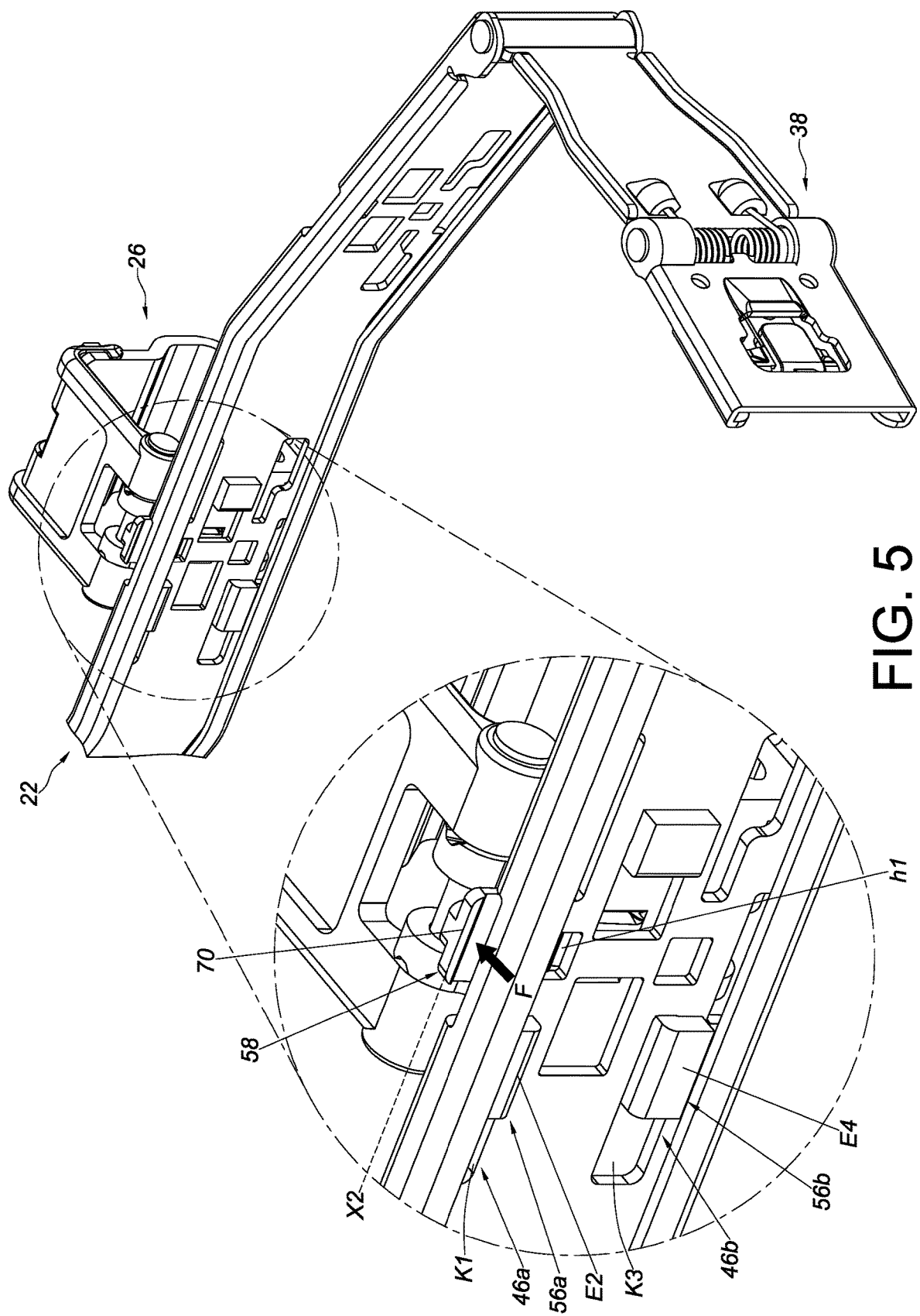
FIG. 5 is a schematic view showing that a releasing portion of the cable management device according to the embodiment of the present invention can be operated.

To detach the cable management device 26 from the first arm 22, referring to FIG. 4 and FIG. 5, the releasing portion 70 of the cable management device 26 can be used to operate the engaging feature 64 of the elastic portion 58 and thereby disengage the engaging feature 64 from the first positioning hole h1 of the first arm 22.

More specifically, a user can easily apply a force F to the releasing portion 70 to switch the elastic portion 58 from the first predetermined state X1 to the second predetermined state X2 and thus bring the engaging feature 64 of the elastic portion 58 out of engagement with the first positioning hole h1 of the first arm 22. After that, the user moves the cable management device 26 in the opposite direction of the second direction D2 (see FIG. 4) until the cable management device 26 arrives at the first position P1 (see FIG. 3) from the second position P2 with respect to the first arm 22. Lastly, the user moves the cable management device 26 in the opposite direction of the first direction D1 to complete the process of detaching the cable management device 26 from the first arm 22 (see FIG. 2).

It can be known from the above that the cable management assembly according to the foregoing embodiment preferably has the following features:

1. The connecting section 60 of the elastic portion 58 of the cable management device 26 is disposed on the wall 54. The elastic section 62 of the elastic portion 58 is connected to the connecting section 60 and is provided with the engaging feature 64.
2. Unlike its prior art counterparts, the cable management device 26 is provided with the releasing portion 70, which extends beyond one of the upper wall 42*a* and the lower wall 42*b* of the first arm 22 to facilitate force application by a user to the releasing portion 70.
3. Once the cable management device 26 is detached from the first connecting structure (i.e., the first mounting hole 46*a*, the first positioning hole h1, and the second mounting hole 46*b*) and the first arm 22 is turned through an angle, the first mounting portion 56*a*, the second mounting portion 56*b*, and the elastic portion 58 of the cable management device 26 can be mounted to the second connecting structure instead in order for the cable management assembly 20 to work after it is turned over from left to right or vice versa. Or, the cable management device 26 can be turned through an angle, allowing the first mounting portion 56*a*, the second mounting portion 56*b*, and the elastic portion 58 of the cable management device 26 to be mounted to the second connecting structure (i.e., the fourth mounting hole 46*d*, the third mounting hole 46*c*, and the second positioning hole h2), the objective being to open the cover 50 of the cable management device 26 in a predetermined direction to facilitate cable storage.
4. As the cable management devices on either arm of the cable management assembly can be easily detached through an operation performed from the front side of the arm, a user wishing to change the mounting mode of the cable management assembly can detach, turn over, and remount the selected one(s) of the cable management devices and the arms without difficulty.

While the present invention has been disclosed through the foregoing preferred embodiment, the embodiment is not intended to be restrictive of the scope of the invention. The scope of patent protection sought by the applicant is defined by the appended claims.

What is claimed is:

1. A cable management assembly, comprising:
a first arm including a first connecting structure and second connecting structure, said first and second connecting structures being configured in a mirror symmetric counterparts relationship to one another, wherein the first connecting structure includes a first mounting hole and a first positioning hole, wherein the first mounting hole includes a first hole portion and a second hole portion, wherein said second connecting structure includes an additional mounting hole and an additional positioning hole positioned in a mirror-symmetrical relationship to said first mounting hole and said first positioning hole, respectively, of said first connecting structure; and
a cable management device configured to be mounted on the first arm in either a first position or a second position, said cable management device being rotationally displaced when mounted in said first position relative to when mounted in said second position, wherein the cable management device includes a wall, a first mounting portion, and an elastic portion, and wherein the first mounting portion is connected to the wall and includes a first extension section and a second extension section bent with respect to the first extension section, and wherein the elastic portion is disposed on the wall;
wherein the elastic portion of the cable management device includes a connecting section and an elastic section, the connecting section is disposed on the wall, and the elastic section is connected to the connecting section and is provided with an engaging feature;
wherein the first extension section of the first mounting portion of the cable management device is able to enter the second hole portion of the first mounting hole of the first arm from the first hole portion, in order for the second extension section of the first mounting portion to be blocked by a first blocking section adjacent to the second hole portion of the first mounting hole, and for the cable management device to be mounted to the first positioning hole through the engaging feature of the elastic section.

2. The cable management assembly of claim 1, wherein the second extension section of the first mounting portion is substantially perpendicularly connected to the first extension section.

3. The cable management assembly of claim 1, wherein the cable management device is configured to be mounted on the first arm in a detachable manner, wherein the cable management device is mountable either to said second connecting structure or to said first connecting structure, subsequent to the first arm rotation through an angle, wherein the first mounting portion and the elastic portion of the cable management device are mountable to the second connecting structure.

4. The cable management assembly of claim 1, wherein the first connecting structure of the first arm includes a second mounting hole, the second mounting hole includes a third hole portion and a fourth hole portion, the cable management device includes a second mounting portion, the second mounting portion is connected to the wall and includes a third extension section and a fourth extension section bent with respect to the third extension section, and the third extension section of the second mounting portion is able to enter the fourth hole portion of the second mounting hole from the third hole portion, in order for the fourth extension section of the second mounting portion to be blocked by a second blocking section adjacent to the fourth hole portion of the second mounting hole.

5. The cable management assembly of claim 4, wherein the first mounting hole and the second mounting hole are located at two opposing positions of the first arm respectively.

6. The cable management assembly of claim 4, wherein the fourth extension section of the second mounting portion and the second extension section of the first mounting portion extend in opposite directions respectively.

7. The cable management assembly of claim 1, wherein the wall of the cable management device has a recess, and the elastic section of the elastic portion corresponds to the recess.

8. The cable management assembly of claim 1, further comprising a second arm, wherein the first arm has a first end portion pivotally connected with respect to a first end portion of the second arm, the first arm has a second end portion provided with a first connection device, and the second arm has a second end portion provided with a second connection device.

9. A cable management assembly, comprising:
a first arm including a first connecting structure, wherein the first connecting structure includes a first mounting hole and, a first positioning hole, and the first mounting hole includes a first hole portion and a second hole portion; and
a cable management device configured to be mounted on the first arm, wherein the cable management device includes a wall, a first mounting portion, and an elastic portion, and wherein the first mounting portion is connected to the wall and includes a first extension section and a second extension section bent with respect to the first extension section, and wherein the elastic portion is disposed on the wall;
wherein the elastic portion of the cable management device includes a connecting section and an elastic section, the connecting section being disposed on the wall, and wherein the elastic section is connected to the connecting section and is provided with an engaging feature;
wherein the first extension section of the first mounting portion of the cable management device enters the second hole portion of the first mounting hole of the first arm from the first hole portion, in order for the second extension section of the first mounting portion to be blocked by a first blocking section adjacent to the second hole portion of the first mounting hole, and for the cable management device to be mounted to the first positioning hole through the engaging feature of the elastic section,
wherein the first arm has an upper wall, a lower wall, and an extension wall connected between the upper wall and the lower wall, wherein the cable management device includes a releasing portion connected to the elastic section of the elastic portion, wherein the engaging feature is disposed between the connecting section and the releasing portion, wherein the releasing portion extends perpendicular to and beyond one of the upper wall and the lower wall, wherein the releasing portion is configured to operate the engaging feature of the elastic section of the elastic portion to disengage the engaging feature from the first positioning hole.

* * * * *